(12) United States Patent
Bhattacharyya

(10) Patent No.: US 7,485,513 B2
(45) Date of Patent: Feb. 3, 2009

(54) ONE-DEVICE NON-VOLATILE RANDOM ACCESS MEMORY CELL

(75) Inventor: Arup Bhattacharyya, Essex Junction, VT (US)

(73) Assignee: Micron Technology, Inc., Boise, ID (US)

( * ) Notice: Subject to any disclaimer, the term of this patent is extended or adjusted under 35 U.S.C. 154(b) by 112 days.

(21) Appl. No.: 11/475,312

(22) Filed: Jun. 27, 2006

(65) Prior Publication Data

US 2006/0240653 A1  Oct. 26, 2006

Related U.S. Application Data

(62) Division of application No. 10/788,230, filed on Feb. 26, 2004, now Pat. No. 7,130,216, which is a division of application No. 10/232,848, filed on Aug. 30, 2002, now Pat. No. 6,903,969.

(51) Int. Cl.
*H01L 21/338* (2006.01)

(52) U.S. Cl. .................. 438/167; 438/197; 438/257; 438/264; 438/581; 438/583; 257/314; 257/315; 257/316; 257/317

(58) Field of Classification Search ......... 438/255–266, 438/570, 581, 583, 630, 651, 682; 257/314–317
See application file for complete search history.

(56) References Cited

U.S. PATENT DOCUMENTS

| | | | |
|---|---|---|---|
| 3,918,033 | A | 11/1975 | Case et al. |
| 3,964,085 | A | 6/1976 | Kahng et al. |
| 3,978,577 | A | 9/1976 | Bhattacharyya et al. |
| 4,488,262 | A | 12/1984 | Basire et al. |
| 4,791,604 | A | 12/1988 | Lienau et al. |
| 4,829,482 | A | 5/1989 | Owen |
| 4,870,470 | A | 9/1989 | Bass, Jr. et al. |

(Continued)

FOREIGN PATENT DOCUMENTS

JP  61-166078  7/1986

(Continued)

OTHER PUBLICATIONS

Bauer, F , et al., "Design aspects of MOS controlled thyristor elements", *International Electron Devices Meeting 1989. Technical Digest*, (1989),297-300.

(Continued)

*Primary Examiner*—Ha Tran T Nguyen
*Assistant Examiner*—Daniel Whalen
(74) *Attorney, Agent, or Firm*—Schwegman, Lundberg & Woessner, P.A.

(57) ABSTRACT

One aspect of the present subject matter relates to a one-device non-volatile memory cell. The memory cell includes a body region, a first diffusion region and a second diffusion region formed in the body region. A channel region is formed in the body region between the first diffusion region and the second diffusion region. The memory cell includes a gate insulator stack formed above the channel region, and a gate to connect to a word line. The gate insulator stack includes a floating plate to selectively hold a charge. The floating plate is connected to the second diffusion region. The memory cell includes a diode that connects the body region to the second diffusion region such that the floating plate is charged when the diode is reversed biased. Other aspects are provided herein.

20 Claims, 11 Drawing Sheets

U.S. PATENT DOCUMENTS

| | | | |
|---|---|---|---|
| 5,017,977 | A | 5/1991 | Richardson |
| 5,043,946 | A | 8/1991 | Yamauchi et al. |
| 5,557,569 | A | 9/1996 | Smayling et al. |
| 5,621,683 | A | 4/1997 | Young |
| 5,801,993 | A | 9/1998 | Choi |
| 5,825,064 | A | 10/1998 | Hayashi et al. |
| 5,856,943 | A * | 1/1999 | Jeng ............ 365/185.14 |
| 5,963,476 | A | 10/1999 | Hung et al. |
| 5,981,335 | A | 11/1999 | Chi |
| 6,011,725 | A | 1/2000 | Eitan |
| 6,104,045 | A | 8/2000 | Forbes et al. |
| 6,111,788 | A * | 8/2000 | Chen et al. ............ 365/185.18 |
| 6,172,397 | B1 | 1/2001 | Oonakado et al. |
| 6,201,734 | B1 | 3/2001 | Sansbury et al. |
| 6,462,359 | B1 | 10/2002 | Nemati et al. |
| 6,545,297 | B1 | 4/2003 | Noble et al. |
| 6,600,188 | B1 | 7/2003 | Jiang et al. |
| 6,653,174 | B1 | 11/2003 | Cho et al. |
| 6,653,175 | B1 | 11/2003 | Nemati et al. |
| 6,674,138 | B1 | 1/2004 | Halliyal et al. |
| 6,740,928 | B2 | 5/2004 | Yoshii et al. |
| 6,778,441 | B2 | 8/2004 | Forbes et al. |
| 6,903,969 | B2 | 6/2005 | Bhattacharyya |
| 6,950,340 | B2 | 9/2005 | Bhattacharyya |
| 7,072,223 | B2 | 7/2006 | Bhattacharyya |
| 7,130,216 | B2 | 10/2006 | Bhattacharyya |
| 7,221,586 | B2 | 5/2007 | Forbes et al. |
| 2003/0042534 | A1 | 3/2003 | Bhattacharyya et al. |
| 2003/0072126 | A1 | 4/2003 | Bhattacharyya |
| 2003/0089942 | A1 | 5/2003 | Bhattacharyya |
| 2003/0151948 | A1 | 8/2003 | Bhattacharyya et al. |
| 2003/0160277 | A1 | 8/2003 | Bhattacharyya et al. |
| 2004/0014304 | A1 | 1/2004 | Bhattacharyya |
| 2005/0012141 | A1 | 1/2005 | Bhattacharyya |
| 2005/0249024 | A1 | 11/2005 | Bhattacharyya |
| 2006/0284246 | A1 | 12/2006 | Forbes et al. |

OTHER PUBLICATIONS

Bhattacharyya, A., "Physical & Electrical Characteristics of LPCVD Silicon Rich Nitride", *ECS Technical Digest, J. Electrochem. Soc.*, 131(11), 691 RDP, New Orleans,(1984),469C.

Carter, R J., "Electrical Characterization of High-k Materials Prepared By Atomic Layer CVD", *IWGI*, (2001),94-99.

Chang, H R., et al., "MOS trench gate field-controlled thyristor", *Technical Digest—International Electron Devices Meeting*, (1989),293-296.

Choi, J D., et al., "A0.15 um NAND Flash Technology with ).11 um2 cell Size for 1 Gbit Flash Memory", *IEDM Technical Digest*, (2000),767-770.

Frohman-Bentchkowsky, D , "An integrated metal-nitride-oxide-silicon (MNOS) memory", *Proceedings of the IEEE*, 57(6), (Jun. 1969),1190-1192.

Han, Kwangseok , "Characteristics of P-Channel Si Nano-Crystal Memory", *IEDM Technical Digest, International Electron Devices Meeting*, (Dec. 10-13, 2000),309-312.

Jagar, S , "Single grain thin-film-transistor (TFT) with SOI CMOS performance formed by metal-induced-lateral-crystallization", *International Electron Devices Meeting 1999. Technical Digest*, (1999),293-6.

Kumar, M. J., "Lateral Schottky Rectifiers for Power Integrated Circuits", *International Workshop on the Physics of Semiconductor Devices*, 11th, 4746, Allied Publishers Ltd., New Delhi, India,(2002),414-421.

Lai, S K., et al., "Comparison and trends in Today's dominant E2 Technologies", *IEDM Technical Digest*, (1986),580-583.

Nemati, F , et al., "A novel high density, low voltage SRAM cell with a vertical NDR device", *1998 Symposium on VLSI Technology Digest of Technical Papers*, (1998),66-7.

Nemati, F , et al., "A novel thyristor-based SRAM cell (T-RAM) for high-speed, low-voltage, giga-scale memories", *International Electron Devices Meeting 1999. Technical Digest*, (1999), 11.5.1-11.5.4.

Ohsawa, Takashi , et al., "Memory design using one-transistor gain cell on SOI", *IEEE International Solid-State Circuits Conference. Digest of Technical Papers*, vol. 1, (2002),452-455.

Okhonin, S., et al., "A SOI capacitor-less 1T-DRAM concept", *2001 IEEE International SOI Conference. Proceedings, IEEE. 2001*, (2000),153-154.

Shinohe, T , et al., "Ultra-high di/dt 2500 V MOS assisted gate-triggered thyristors (MAGTs) for high repetition excimer laser system", *International Electron Devices Meeting 1989. Technical Digest*, (1989),301-4.

Sze, S. M., "Table 3: Measured Schottky Barrier Heights", *In: Physics of Semiconductor Devices*, John Wiley & Sons, Inc.,(1981), p. 291.

Tiwari, Sandip , et al., "Volatile and Non-Volatile Memories in Silicon with Nano-Crystal Storage", *Int'l Electron Devices Meeting: Technical Digest*, Washington, DC,(Dec. 1995),521-524.

Van Meer, H , "Ultra-thin film fully-depleted SOI CMOS with raised G/S/D device architecture for sub-100 nm applications", *2001 IEEE International SOI Conference*, (2001),45-6.

Zhang, H. , "Atomic Layer Deposition of High Dielectric Constant Nanolaminates", *Journal of The Electrochemical Society*, 148(4), (Apr. 2001),F63-F66.

* cited by examiner

ONE-DEVICE NON-VOLATILE RANDOM ACCESS MEMORY CELL

CROSS REFERENCE TO RELATED APPLICATIONS

This application is a Divisional of U.S. application Ser. No. 10/788,230 filed Feb. 26, 2004 now U.S. Pat. No. 7,130,216, which is a Divisional of U.S. application Ser. No. 10/232,848 filed Aug. 30, 2002 now U.S. Pat. No. 6,903,969 which is incorporated herein by reference.

This application is related to the following commonly assigned U.S. patent applications which are herein incorporated by reference in their entireties:

"Scalable Flash/NV Structures & Devices With Enhanced Endurance," U.S. application Ser. No. 09/944,985, filed on Aug. 30, 2001; "Asymmetric Engineered Nonvolatile Memory Device," U.S. application Ser. No. 10/075,484, filed Feb. 12, 2002; "Memory Utilizing Oxide Nanolaminates," U.S. application Ser. No. 10/190,717, filed on Jul. 8, 2002; and "One Transistor SOI Non-Volatile Random Access Memory Cell" U.S. application Ser. No. 10/232,846, filed Aug. 30, 2002.

TECHNICAL FIELD

This disclosure relates generally to integrated circuits, and more particularly, to non-volatile memory.

BACKGROUND

Known dynamic random access memory (DRAM) devices include a switching transistor and an integrated storage capacitor tied to the storage node of the transistor. Incorporating a stacked capacitor or a trench capacitor in parallel with the depletion capacitance of the floating storage node enhances charge storage. Due to a finite charge leakage across the depletion layer, the capacitor is frequently recharged or refreshed to ensure data integrity in the DRAM device. Thus, such a DRAM device is volatile. A power failure causes permanent data loss in a DRAM device. DRAM devices are relatively inexpensive, power efficient, and fast compared to non-volatile random access memory (NVRAM) devices.

NVRAM devices, such as Flash, EPROM, EEPROM, etc., store charge using a floating gate or a floating plate. Charge trapping centers and associated potential wells are created by forming nano-particles of metals or semiconductors in a large band gap insulating matrix, or by forming nano-layers of metal, semiconductor or a small band gap insulator that interface with one or more large band gap insulating layers. The floating plate or gate can be formed as an integral part of the gate insulator stack of the switching transistor.

Floating plate non-volatile memory devices have been formed using a gate insulator stack with silicon-rich insulators. In these devices, injected charges (electrons or holes) are trapped and retained in local quantum wells provided by nano-particles of silicon embedded in a matrix of a high band gap insulator such as silicon dioxide ($SiO_2$) or silicon nitride ($Si_3N_4$). In addition to silicon trapping centers, other trapping centers include tungsten particles embedded in $SiO_2$, gold particles embedded in $SiO_2$, and a tungsten oxide layer embedded in $SiO_2$.

Field emission across the surrounding insulator causes the stored charge to leak. The stored charge leakage from the floating plate or floating gate is negligible for non-volatile memory devices because of the high band gap insulator. For example, silicon dioxide ($SiO_2$) has a 9 ev band gap, and oxide-nitride-oxide (ONO) and other insulators have a band gap in the range of 4.5 ev to 9 ev. Thus, the memory device retains stored data throughout a device's lifetime.

However, there are problems associated with NVRAM devices. The writing process, also referred to as "write-erase programming," for non-volatile memory is slow and energy inefficient, and requires complex high voltage circuitry for generating and routing high voltage. Additionally, the write-erase programming for non-volatile memory involves high-field phenomena (hot carrier or field emission) that degrades the surrounding insulator. The degradation of the insulator eventually causes significant leakage of the stored charge. Thus, the high-field phenomena negatively affects the endurance (the number of write/erase cycles) of the NVRAM devices. The number of cycles of writing and erasing is typically limited to 1 E6 cycles. Therefore, the available applications for these known NVRAM devices is limited.

Therefore, there is a need in the art to provide improved non-volatile memory.

DETAILED DESCRIPTION

Figure 1A:
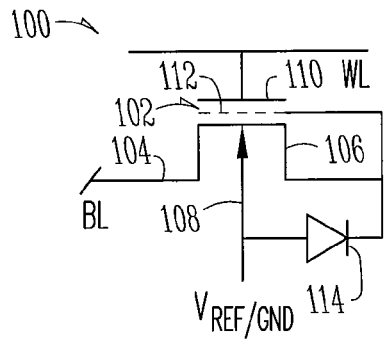
FIG. 1A is a schematic illustration of the non-volatile dynamic random access memory (NVDRAM) according to various embodiments of the present subject matter.

The following detailed description refers to the accompanying drawings which show, by way of illustration, specific aspects and embodiments in which the present subject matter may be practiced. These embodiments are described in sufficient detail to enable those skilled in the art to practice the present subject matter. The various embodiments of the present subject matter are not necessarily mutually exclusive. Other embodiments may be utilized and structural, logical, and electrical changes may be made without departing from the scope of the present subject matter. The following detailed description is, therefore, not to be taken in a limiting sense, and the scope of the present subject matter is defined only by the appended claims, along with the full scope of equivalents to which such claims are entitled.

The present subject mater provides a dense one-device memory cell with DRAM-like reading and writing capabilities and with non-volatile data retention that eliminates the need to refresh data over the life of the device. Thus, relatively simple circuitry can be used to read the memory cell. A switching transistor is fabricated with a built-in floating plate in the gate insulator stack and with a built-in diode. The built-in diode charges the floating plate when the cell is written. Programming the cell is fast, and does not require high programming voltage.

One aspect of the present subject matter relates to a one-device non-volatile memory cell. This memory cell is also referred to as a non-volatile dynamic random access memory (NVDRAM) because of the cell's DRAM-like read/write capabilities. However, the term NVDRAM should not be read to limit the memory cell of the present subject matter. According to various embodiments, the memory cell includes a body region, a first diffusion region and a second diffusion region. A channel region is formed in the body region between the first diffusion region and the second diffusion region. The memory cell includes a gate insulator stack formed above the channel region, and a gate formed above the gate insulator stack. The gate insulator stack includes a floating plate to selectively hold a charge. The floating plate is connected to the second diffusion region. The memory cell includes a diode that connects the body region to the second diffusion region such that the floating plate is charged when the diode is reversed biased. In various embodiments, the layer of metal silicide extends to contact the second diffusion region such that the second diffusion region is electrically connected to the floating plate. In various embodiments, a semiconductor junction diode is formed between the substrate and a diffusion region associated with a storage node, such that when the diode is reversed biased, the diode charges the floating plate. In various embodiments, a Schottky diode is formed between the layer of metal silicide and the substrate such that the floating plate is discharged when the Schottky diode conducts.

The present subject matter relates to non-volatile DRAM cells. The memory cell includes a transistor with a floating plate and at least one built-in diode. Charge trapping centers are created in the gate insulator stack by interfacing conducting metal-silicides with appropriate metal-oxides (and in various embodiments, by interfacing transition-metal silicides with transition-metal oxides) to achieve desired charge trapping and retention characteristics.

In the currently scaled CMOS technology, the built-in lateral n+/n−/p diode of the source-substrate part of the FET can be characterized to have relatively low reverse breakdown voltage and relatively high reverse leakage (approximately 1 E-8 to 1 E-6 A/cm$^2$) with respect to a Schottky diode with negligible forward current up to a forward bias of 0.6 volt. In various embodiments, Schottky barrier heights for metal or metal silicide-silicon (p-type or n-type) are varied by selecting an appropriate metal or metal-silicide to be low barrier Schottky or high barrier Schottky. The Schottky diode is a majority carrier device, and as such has very fast time constant. The Schottky diode can be fabricated to have very low reverse leakage (<<1 E-8 A/cm$^2$) and to conduct a large forward current at negligible forward voltage drop (e.g. approximately 0.6-0.7 volts).

Various embodiments of the present subject matter use these characteristic differences of the Schottky and lateral diodes to write and erase the cell. Additionally, nano-layers of metal/metal-oxides (and in various embodiments, transition metal/metal-oxides) are capable of being readily fabricated by recently developed ALD techniques. The present subject matter uses these ALD techniques to create the gate insulator stack.

FIG. 1A is a schematic illustration of the non-volatile dynamic random access memory (NVDRAM) according to various embodiments of the present subject matter. The illustrated NVDRAM cell 100 includes an NFET transistor 102. The present subject is not limited to NFET transistors, however. The transistor 102 includes a first diffusion region (e.g. a drain) 104 connected to a bit line (BL) of the cell 100, a second diffusion region (e.g. a source) 106 that functions as a storage node, a body region 108 formed by a substrate or well, a gate 110 connected to a word line (WL), and a floating plate 112. The body region 108 is connected to a reference voltage such as, for example, ground. In an NFET transistor 102, the body region 108 is a p-type semiconductor and the second diffusion region 106 is an n+ semiconductor. The body region 108 and the second diffusion region 106 are designed to provide a built-in lateral p-n+ semiconductor junction diode 114. The second diffusion region 106 is electrically connected to the floating plate 112 of the gate insulator stack. In various embodiments, and as will be shown in more detail below, a layer of conducting metal-silicide forms the floating plate 112 in the gate insulator stack and contacts the second diffusion region 106.

When the lateral junction diode 114 is reversed biased, electrons accumulate on the floating plate 112 causing the memory cell 100 to be written. In various embodiments, the memory cell 100 is erased by injecting hot hole carriers by avalanche breakdown to neutralize the trapped electrons. In various embodiments, the memory cell 100 is erased by appropriately imposing a potential across the gate dielectric to remove the trapped electrons by tunneling from the floating plate either to the top electrode or to the substrate. In various embodiments, the memory cell 100 is erased by forward biasing a Schottky diode, which is generally illustrated in FIG. 1C. As is described in more detail later in this disclosure, the Schottky diode is capable of being fabricated as a low forward voltage drop and a high current device to provide the cell with desired erase characteristics.

Figure 1B:
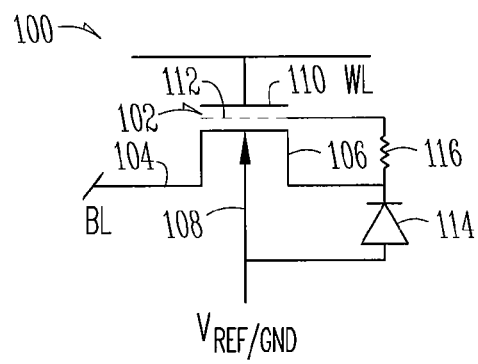
FIG. 1B is a schematic illustration of the NVDRAM according to various embodiments of the present subject matter.
Figure 1C:
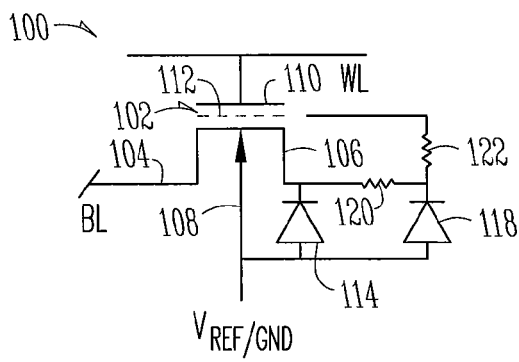
FIG. 1C is a schematic illustration of the NVDRAM according to various embodiments of the present subject matter.

FIG. 1B is a schematic illustration of the NVDRAM according to various embodiments of the present subject matter. This schematic illustrates a lateral semiconductor junction (p-n+) diode 114 extending from the body region 108 to the second diffusion region 106. The ohmic connection associated with the metal-silicide between the second diffusion region 106 and the floating plate 112 is illustrated as a resistor 116.

FIG. 1C is a schematic illustration of the NVDRAM according to various embodiments of the present subject matter. This schematic illustrate a Schottky diode 118 formed in parallel with the lateral semiconductor junction (p-n+) diode 114. The Schottky diode is formed by a junction between the metal-silicide and the body region 108. Resistor 120 illustrates the contact resistance associated with the junction between the second diffusion region 106 and the metal-silicide. Resistor 122 illustrates the ohmic connection to the floating plate 112 associated with the metal-silicide.

According to various embodiments, the NVDRAM incorporates a floating plate gate insulator stack for the transfer gate and provides a unique means of trapping (also referred to herein as charging or writing) and de-trapping (also referred to herein as discharging or erasing) the floating plate 112 via a combination of built-in lateral and Schottky diodes 114 and 118 at a storage node 106 which is electrically tied to the floating plate 112. The trapping and de-trapping of the floating plate also is referred to herein as programming. The entire memory cell 100 is integrated within a single transistor (one device) configuration. During writing (high: '1') and erasing (low: '0') the parallel diodes 114 and 118 are respectively reverse and forward biased. During writing, the reverse-biased n+-p lateral diode 114 is active and supplies electrons that are trapped at the floating plate 112, which raises the threshold of the cell transistor 102. That is, the reverse biased, lateral semiconductor junction diode 114 charges the floating plate 112. During erasing, the forward-biased silicide Schottky diode 118 is active and supplies holes to neutralize the traps in the floating plate 112, thereby lowering the threshold of the cell transistor 102.

The time constants associated with such charge transfer and trapping/de-trapping are very fast, resulting in a programming speed that is improved by many orders of magnitude. At the written '1' state, the threshold voltage ($V_T$) of the device (NFET) is raised high due to electrons trapped in the plate and the transistor is non-conducting. At the erased state (written '0'), the threshold voltage ($V_T$) is low and the device is conducting. Reading '1' or '0' is accomplished much the same way as standard SRAM or EPROM device and is therefore fast.

The dynamics of trapped charge leakage (charge retention) depend on the band gap of the materials selected for the floating plate insulator stack. Charge retention is improved by many orders of magnitude over the leakage mechanisms associated with the reverse biased p-n junctions of DRAM devices. Charge transport to and from the charge centers during writing and erasing is by direct tunneling and is exponentially dependent to the potential across charge centers and the conducting plate. However, the field across the gate insulator stack during such operation is significantly lower than those of conventional non-volatile devices and as a result endurance (number of write/erase operations) is expected to be comparable to conventional DRAM devices. Memory arrays using such devices are expected to have speed/power equal or better than the conventional DRAM while storing data permanently into the memory cell and providing data non-volatility.

Figure 2A:
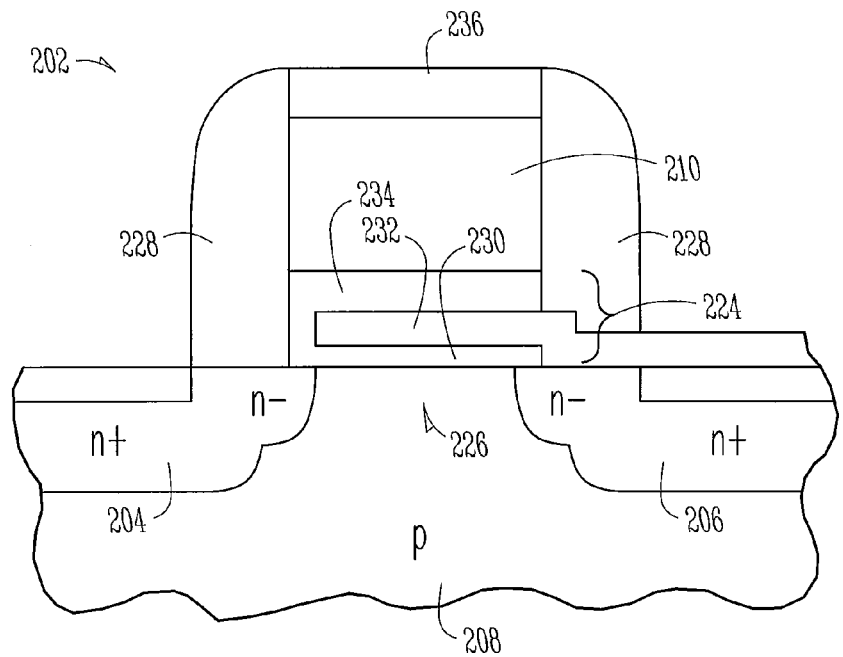
FIG. 2A illustrates an NVDRAM transistor according to various embodiments of the present subject matter.

FIG. 2A illustrates an NVDRAM transistor according to various embodiments of the present subject matter. The illustrated transistor 202 is fabricated in a substrate or well which forms a body region 208 of the transistor. The transistor 202 includes a first diffusion region 204, a second diffusion region 206, a gate insulator stack 224, and a gate 210. A channel region 226 is defined between the first diffusion region 204 and the second diffusion region 206. Oxide-nitride-oxide (ONO) spacers 228 are formed. In an NFET embodiment, the body region 208 is a p-type semiconductor material, and the first and second diffusion regions 204 and 206 are an n-type semiconductor material as illustrated in the figure.

In one embodiment, the gate insulator stack 224 includes a first tunnel barrier layer 230 formed over the channel region 226, a metal-silicide layer 232 that functions as a floating plate formed over the tunnel barrier layer 230, and a second tunnel barrier 234 formed over the floating plate 232. In various embodiments, the metal-silicide layer 232 includes a transition-metal silicide layer. A polysilicon gate 210 is formed on the gate insulator stack 224. A silicide 236, such as a cobalt or nickel silicide, is formed in the polysilicon gate as illustrated in the figure. It is noted that a diode such as diode 114 in FIG. 1A will hold a charge on the floating gate for a time that may be sufficiently long for some applications. However, the diode has a leakage current.

In various embodiments, the floating plate is formed with relatively shallow traps to hold the charge. In various embodiments, such as is illustrated below in FIG. 2B, the charge trapping centers are created by interfacing conducting metal-silicides with appropriate metal-oxides (and in various embodiments, transition-metal oxides) to achieve desired charge trapping and retention characteristics.

Figure 2B:
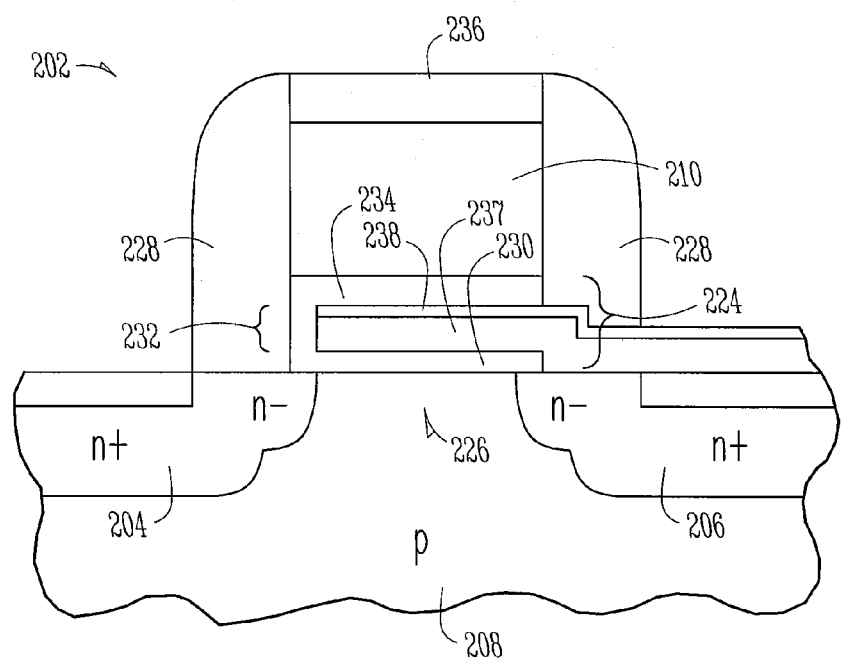
FIG. 2B illustrates an NVDRAM transistor according to various embodiments of the present subject matter.

FIG. 2B illustrates an NVDRAM transistor according to various embodiments of the present subject matter. The illustrated gate stack 224 includes a first tunnel barrier 230, floating plate-charge center layers 232, and a second tunnel barrier layer 234. In various embodiments, the first tunnel barrier 230 includes a 3 nm to 5 nm layer of $SiO_2$. In various embodiments, the second tunnel barrier 234 includes a 3 nm to 5 nm layer of $SiO_2$. In various embodiments, the second tunnel barrier 234 includes a layer of $Al_2O_3$ with an equivalent oxide thickness ($T_{EQ.OX}$) of 3 nm to 5 nm. The tunnel-blocking layers 230 and 234 are trap-free high band gap insulators to prevent charge loss to substrate or to gate. The tunnel-blocking layers can be other insulators besides $SiO_2$ and $Al_2O_3$ depending on the leakage specification an tolerance of the cell and the operational specifications such as Vdd and the like.

In various embodiments, the floating plate-charge center layers 232 include compatible combinations of metal-silicides 237 and metal oxides 238. In various embodiments, the floating plate-charge center layers include a transition metal-silicide layer 237 (typically 10 nm to 30 nm thick) with a transition metal-oxide layer 238 of 1 nm to 2 nm thick. In various embodiments, the transition metal-oxides are deposited using atomic layer deposition (ALD) techniques. Various embodiments provide a $ZrSi_2$—$ZrO_2$ combination. Various embodiments provide a $TiSi_2$—$TiO_2$ combination. Various embodiments provide a $HfSi_2$—$HfO_2$ combination. However, the present subject matter is not limited to a particular combination, as other combinations are also viable that meet the diode characteristics of the transition-metal silicide and the band gap characteristics of the transition-metal oxide. The transition-metal silicides have lower Schottky barrier heights, and have large forward current and low reverse leakage characteristics. The transition-metal oxides are characterized by approximately 3 ev to 5 ev of band gap with nearly 1 ev of electron barrier height from the silicide to the dielectric conduction band. This provides a good balance of charge retention as well as the ease of charge transport to and from the charge centers of the transition metal oxides.

Figure 3:
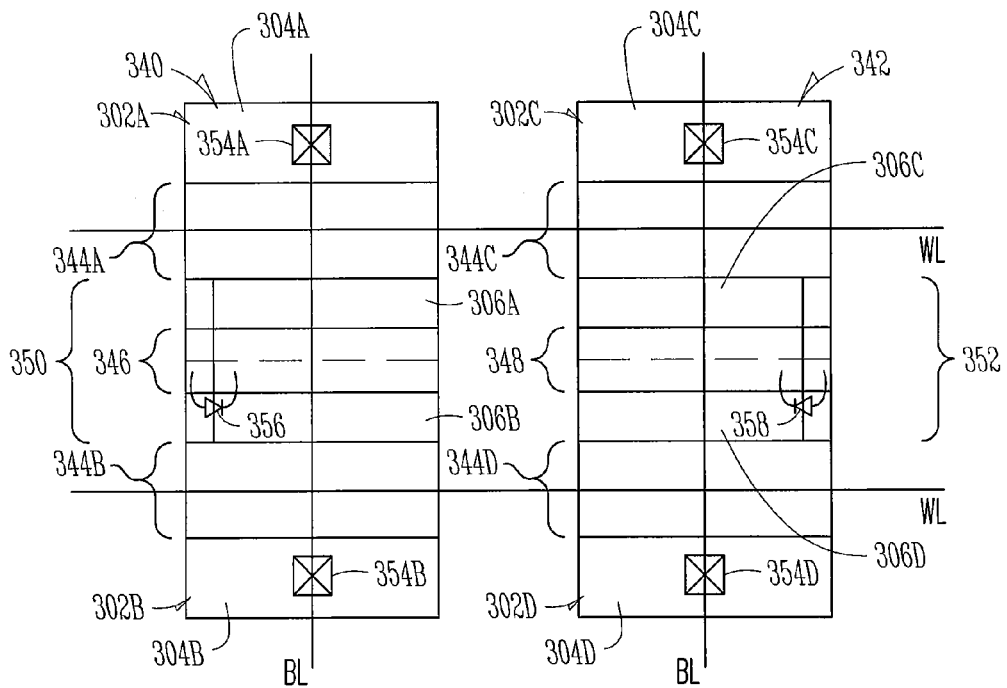
FIG. 3 is a partial top view of an NVDRAM array illustrating the formation of four adjacent NVDRAM cells having NFET transistors, and further illustrating bit line and word line representations superimposed on the array, according to various embodiments of the present subject matter.

FIG. 3 is a partial top view of an NVDRAM array illustrating the formation of four adjacent NVDRAM cells having NFET transistors, and further illustrating bit line and word line representations superimposed on the array, according to various embodiments of the present subject matter. Active regions 340 and 342 for the switching transistors are defined in a substrate. Four transistors 302A, 302B, 302C, and 302D are capable of being formed in the illustrated active regions 340 and 342.

NFET transistors are formed on a p-type substrate or well region. A gate insulator stack and a gate are formed at 344A for transistor 302A, at 344B for transistor 302B, at 344C for transistor 302C, and at 344D for transistor 302D. During the fabrication of the gate insulator stack, a metal silicide layer is formed to contact the substrate at 346 for transistors 302A and 302B, and at 348 for transistors 302C and 302D. After the gate is defined, the substrate is heavily doped with n-type impurities to form a first n+ diffusion region (or drain region) at 304A for transistor 302A, at 304B for transistor 302B, at 304C for transistor 302C, and at 304D for transistor 302D, and to form a second n+ diffusion region (or source or floating node region) at 306A for transistor 302A, at 306B for transistor 302B, at 306C for transistor 302C, and at 306D for transistor 302D. A special n+ doping mask is used such that areas 350 and 352, along with the substrate areas under the defined gate areas 344A, 344B, 344C, 344D remain doped with p-type impurities. Bit line contacts are shown at 354A, 354B, 354C and 354D for the bit lines (BL). Word lines (WL) contacts the gates. The metal-silicide layer contacts the p-type substrate, and thus forms Schottky diodes at 350 and 352. Lateral semiconductor junction diodes are formed at the p-n+ junctions at 356 and 358. In the illustrated array, adjacent memory cells share Schottky diodes and lateral junction diodes, and thus save space. One of ordinary skill in the art will understand that the bit line contacts can be shared by adjacent memory cells as well.

Figure 4A:
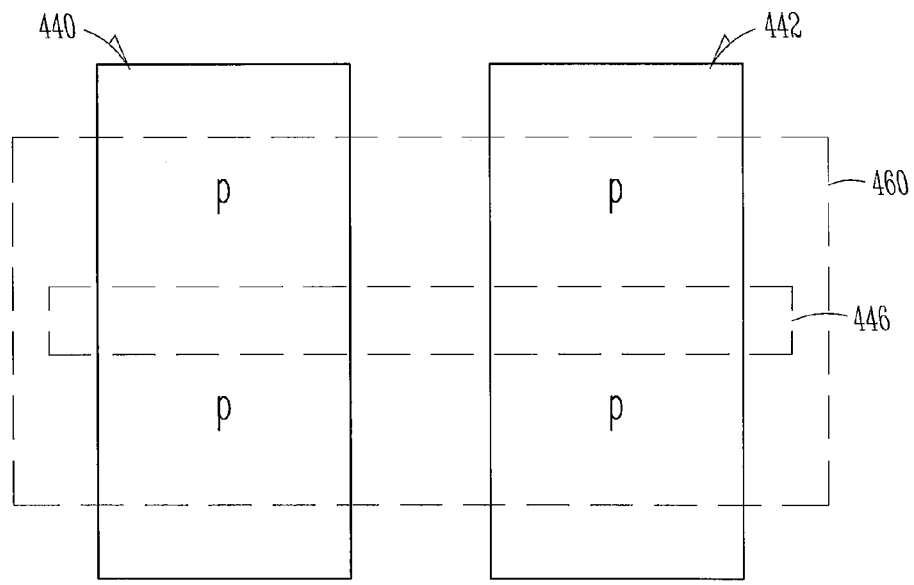
FIGS. 4A-4D illustrate processes for fabricating the NVDRAM array of FIG. 3, according to various embodiments of the present subject matter.
Figure 4B:
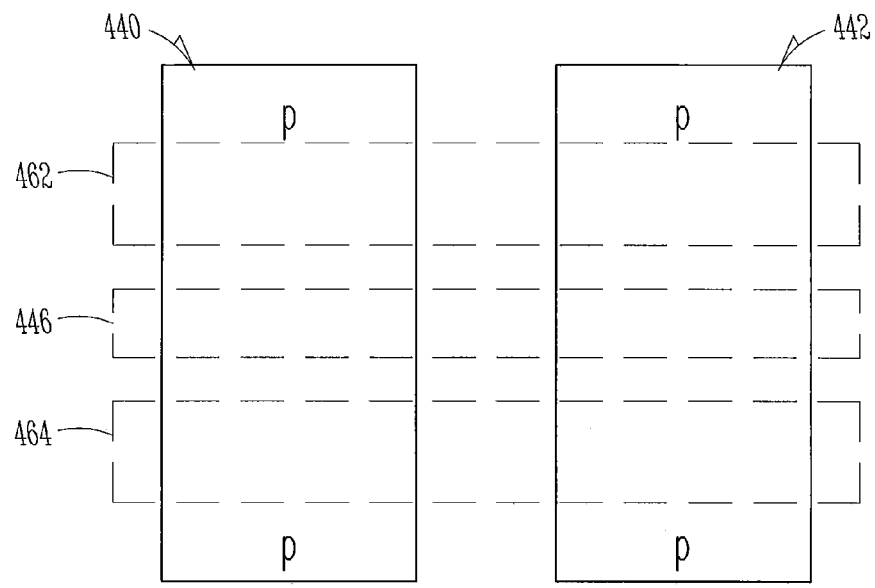

FIGS. 4A-4D illustrate processes for fabricating the NVDRAM array of FIG. 3, according to various embodiments of the present subject matter. Referring to FIG. 4A, transistor active regions 440 and 442 are defined in a p-type substrate. A first layer of tunnel oxide (e.g. $SiO_2$) is deposited over the active regions 440 and 442. The first tunnel oxide layer is selectively removed at 446 for a desired storage node region. One of ordinary skill in the art will understand, upon reading and comprehending this disclosure, that the Schottky diode and lateral junction diode will be formed at the desired storage node region 446. A layer of metal-silicide (or transition-metal silicide) is deposited using the mask 460. The metal silicide contacts the substrate at 446, and extends into the gate insulator stack region. However, an appropriate tolerance margin is used to prevent the metal silicide from extending beyond the gate insulator stack region into the area where the first diffusion region will be formed. A layer of metal oxide (or transition metal oxide) is deposited on the layer of metal silicide. This metal oxide functions as shallow charge traps to hold charge in the gate insulator stack. A second layer of tunnel oxide is formed on the metal oxide layer. A polysilicon layer is formed on the second layer of tunnel oxide, and a polysilicon gate is defined therein as represented by 462 and 464 in FIG. 4B. FIG. 4B also illustrates the area 446 where the metal-silicide layer contacts the substrate.

Figure 4C:
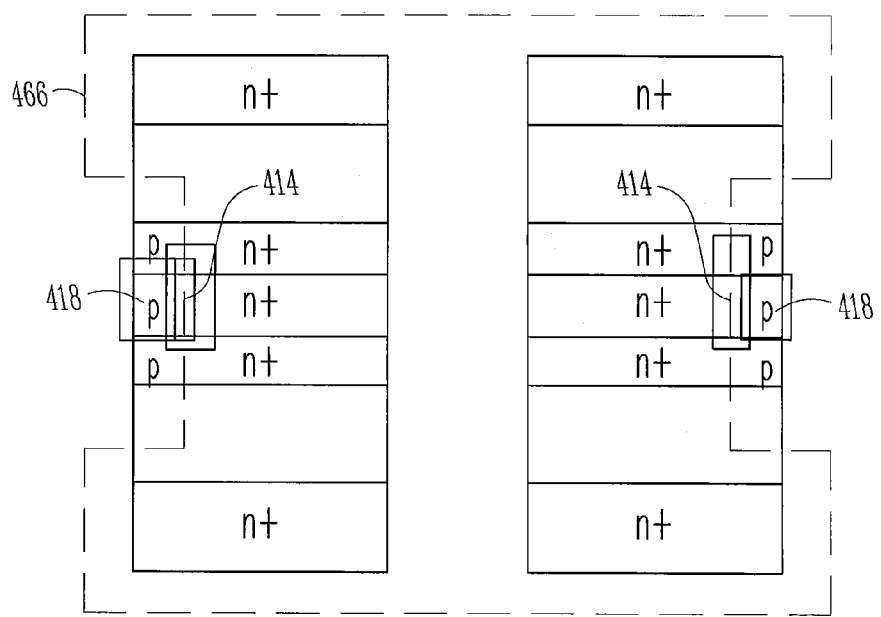

FIG. 4C illustrates the outline of the block-mask 466 to define the asymmetric n+ diffusion at the source side of the device. The block mask 466 defines the built-in Schottky diode, generally represented at region 418, also defines the built-in lateral n+-p diode, generally represented at region 414. Both the poly-silicon gate and diffusion channel regions are silicided after the gate definition and n+ source/drain implant. The over-layer of the second silicide overlaps the buried silicide and also connects the gate insulator stack.

Figure 4D:
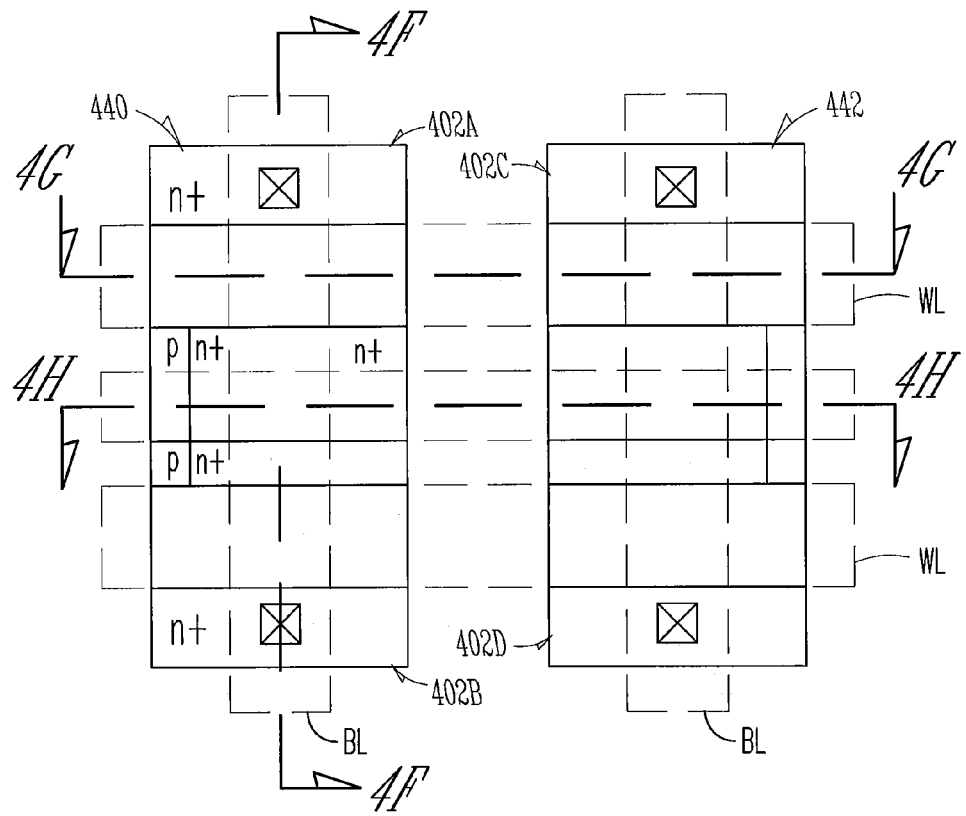

FIG. 4D illustrates a top view of the fabricated memory array. This top view serves as a point of reference for the cross-sectional views of FIGS. 4F-H. The NVDRAM of the present subject matter is capable of being formed using standard silicon gate FET device processes along with the following unique processes. One process relates to forming the metal-silicide layer to form a Schottky body contact which provides the built-in Schottky diode. The first layer of gate oxide (e.g. $SiO_2$) is first grown over the channel active region in a standard way, and a body contact mask removes the oxide over the selected "source" region of p-substrate for the Schottky metal-silicide layer (e.g. $ZrSi_2$). The $ZrSi_2$ layer is formed or deposited. A metal oxide (e.g. $ZrO_2$) is deposited using an atomic layer deposition (ALD) process. The metal oxide is selectively defined to ensure appropriate overlap into the FET gate region. This definition of the metal oxide and underlayer $ZrSi_2$ plate requires a second additional mask. A layer of stoichiometric $SiO_2$ or $Al_2O_3$ is then deposited. The polysilicon gate is deposited and defined. A unique block mask defines the source-drain n+ implant region while also implanting the polysilicon gate. Subsequently, all processing steps could be those of standard CMOS or SOI-CMOS FET technology including those used for NiSi or $CoSi_2$ for forming a second silicide layer in the gate and channel regions. The second silicide layer overlaps the first silicide layer in selected regions of the channel.

Figure 4E:
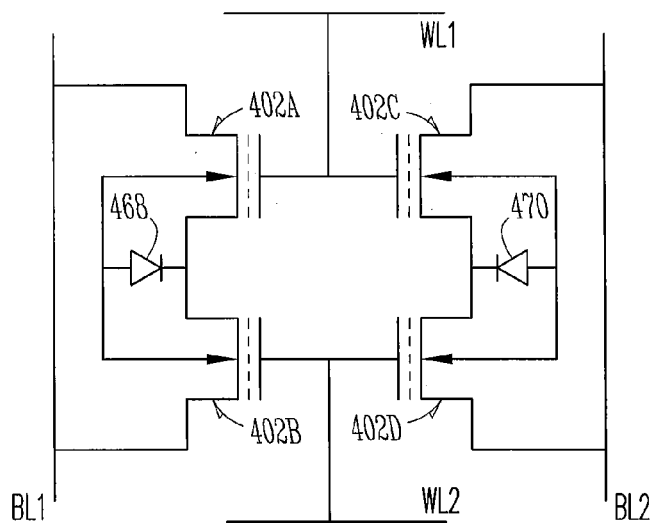
FIG. 4E is a schematic illustration of the NVDRAM array illustrated in FIGS. 3 and 4D according to various embodiments of the present subject matter.

FIG. 4E is a schematic illustration of the NVDRAM array illustrated in FIGS. 3 and 4D according to various embodiments of the present subject matter. In the illustrated schematic, both diode 468 and diode 470 represent a combination of a Schottky diode and a lateral p-n+ junction diode, such as is generally illustrated by diode 114 in FIG. 1C. One of ordinary skill in the art will understand, upon reading and comprehending this disclosure, that transistors 402A and 402B share a Schottky diode and lateral junction diode represented by diode 468, and that transistors 402C and 402D share a Schottky diode and lateral junction diode represented by diode 470.

Figure 4F:
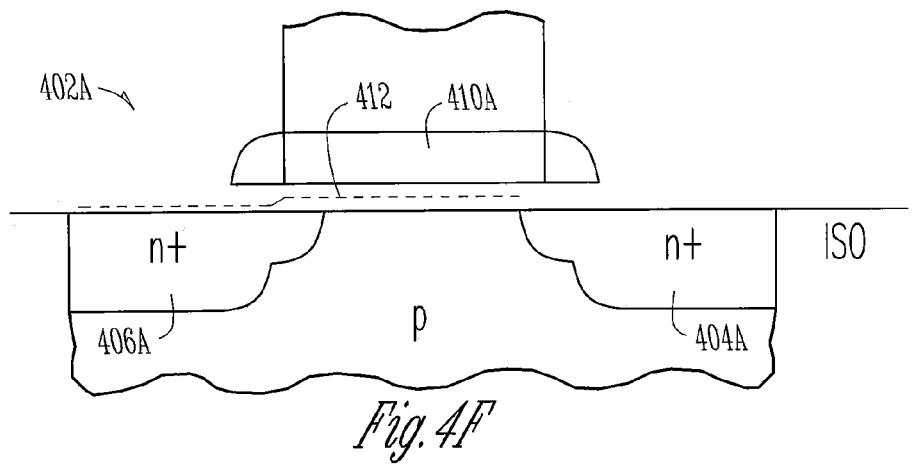
FIG. 4F illustrates a cross-sectional view taken along line 4F-4F of FIG. 4D.

FIG. 4F illustrates a cross-sectional view taken along line 4F-4F of FIG. 4D. The illustrated transistor 402A includes a first diffusion region or drain region 404A and a second diffusion region or source region 406A formed in a substrate. A transistor gate 410A is separated from the substrate by a gate insulator stack. The illustrated gate insulator stack includes a floating plate 412, which includes a layer of metal silicide as represented by the dotted line. The floating plate is sandwiched between a first tunnel oxide and a second tunnel oxide in the gate insulator stack. A window is formed in the first tunnel oxide such that, when the metal silicide layer 412 is deposited, it contacts the second diffusion region 406A. This junction between the metal silicide layer and the second diffusion region provides the Schottky diode. Schottky barrier heights for metal or metal silicide-silicon (p-type or n-type) is capable of being varied by selecting an appropriate metal or metal-silicide to be a low barrier Schottky or a high barrier Schottky. The Schottky diode is a majority carrier device, and thus has a very fast time constant. Additionally, the Schottky diode can be fabricated to have a very low reverse leakage (<<1 E-8 $A/cm^2$) while conducting a large forward current at a negligible voltage drop.

Figure 4G:
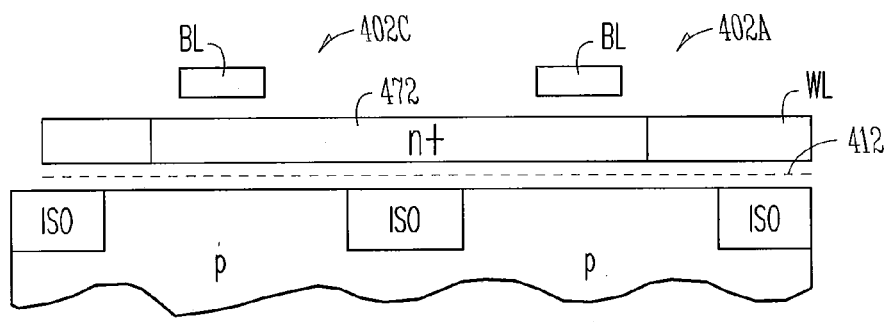
FIG. 4G illustrates a cross-sectional view taken along line 4G-4G of FIG. 4D.

FIG. 4G illustrates a cross-sectional view taken along line 4G-4G of FIG. 4D. The transistor active regions 440 and 442 formed in a p-type substrate, and are separated by isolation regions. A first tunnel oxide layer is formed above the p-type substrate, a floating plate, including a metal silicide layer 412, is formed above the first tunnel oxide layer, and a second tunnel oxide layer is formed above the floating plate. The word line (WL) includes a n+ doped polysilicon region 472, which corresponds to the asymmetric n+ source/drain mask. Bit lines (BL) are formed above the word line (WL) as illustrated.

Figure 4H:
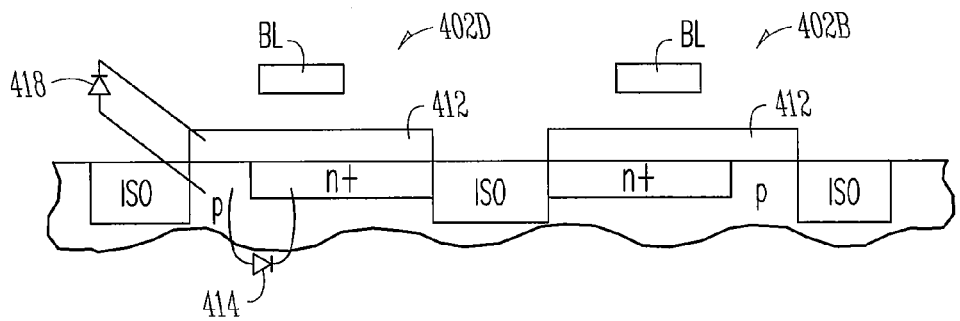
FIG. 4H illustrates a cross-sectional view taken along line 4H-4H of FIG. 4D.

FIG. 4H illustrates a cross-sectional view taken along line 4H-4H of FIG. 4D. The transistor active regions 440 and 442 formed in a p-type substrate, and are separated by isolation regions. The asymmetric n+ source/drain mask provides the illustrated doping profile in which both a p substrate and an n+ diffusion region share a top surface of the transistor active regions. The first tunnel oxide is selectively removed from the top surface at source or storage node region of the cell so that the metal silicide layer directly contacts both the p substrate and the n+ second diffusion region or source. A lateral semiconductor junction diode is formed by the p-n+ junction as illustrated by diode 414. The junction between the n+ diffusion region and the metal silicide is an ohmic contact. A Schottky diode is formed by the junction between the p substrate and the metal silicide as illustrated by diode 418. Bit lines are formed above the transistor active regions as illustrated.

Figure 5A:
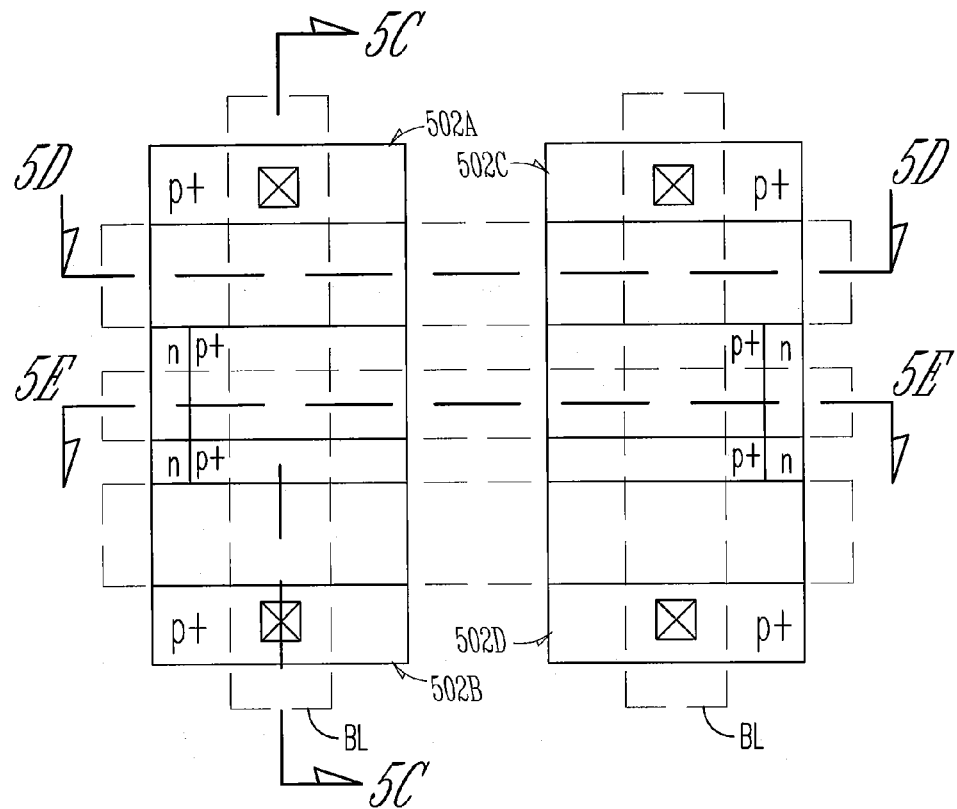
FIG. 5A illustrates a partial top view of an NVDRAM array illustrating the formation of four adjacent NVDRAM cell having PFET transistors according to various aspects of the present subject matter.

FIG. 5A illustrates a partial top view of an NVDRAM array illustrating the formation of four adjacent NVDRAM cell having PFET transistors according to various aspects of the present subject matter. In the PFET cell charge polarities are reversed. The PFET cell is inherently slower than the NFET cell because holes are less mobile than electrons. Thus, the NFET cell has advantages over the PFET cell. However, the basic concepts of the present subject are valid for both NFET and PFET cells. One of ordinary skill in the art will understand, upon reading and comprehending this disclosure, how to design both NFET and PFET cell embodiments.

Figure 5B:
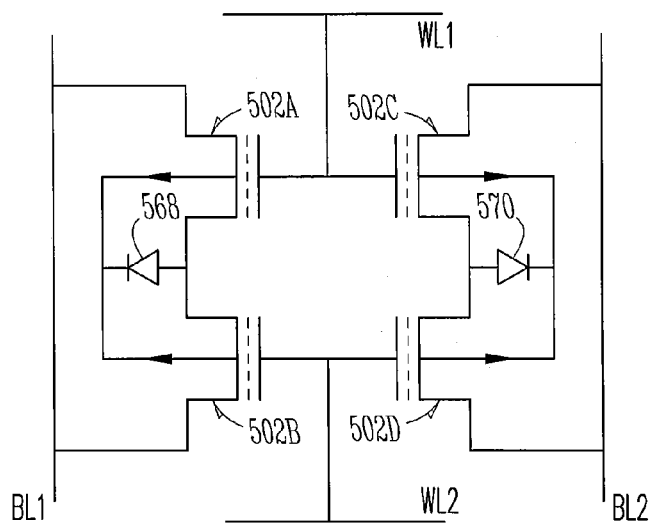
FIG. 5B is a schematic illustration of the NVDRAM array illustrated in FIG. 5A according to various embodiments of the present subject matter.

FIG. 5B is a schematic illustration of the NVDRAM array illustrated in FIG. 5A according to various embodiments of the present subject matter. In the illustrated schematic, both diode 568 and diode 570 represent a combination of a Schottky diode and a lateral p+-n junction diode. One of ordinary skill in the art will understand, upon reading and comprehending this disclosure, that adjacent transistors 502A and 502B share a Schottky diode and lateral junction diode represented by diode 568, and that adjacent transistors 502C and 502D share a Schottky diode and lateral junction diode represented by diode 570.

Figure 5C:
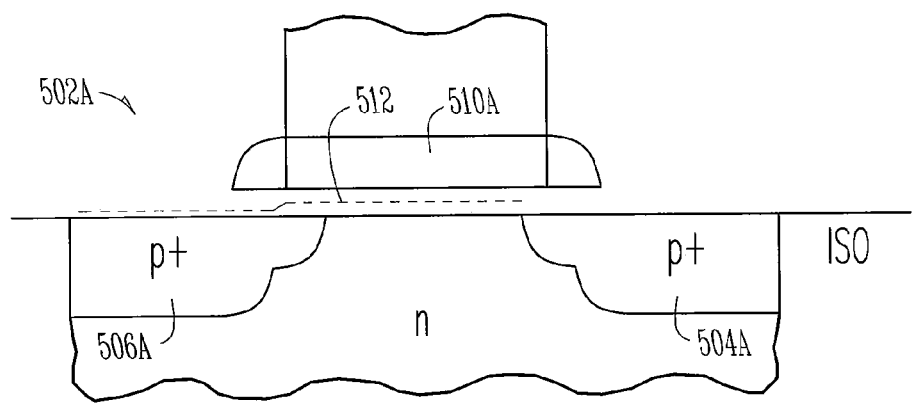
FIG. 5C illustrates a cross-sectional view taken along line 5C-5C of FIG. 5A.
Figure 5D:
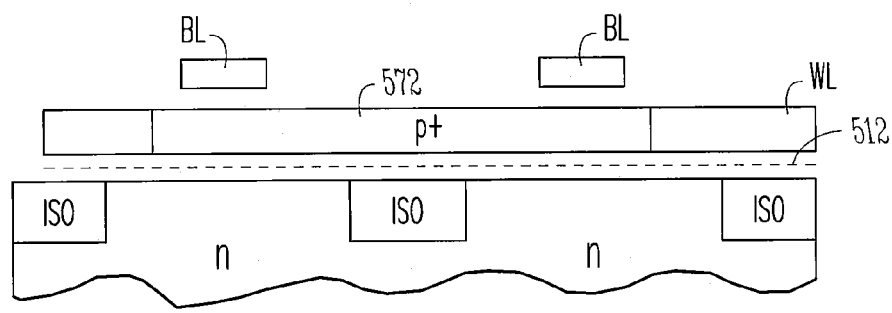
FIG. 5D illustrates a cross-sectional view taken along line 5D-5D of FIG. 5A.

FIG. 5C illustrates a cross-sectional view taken along line 5C-5C of FIG. 5A. The illustrated transistor 502A includes a first diffusion region or drain region 504A and a second diffusion region or source region 506A formed in a substrate. A transistor gate 510A is separated from the substrate by a gate insulator stack. The illustrated gate insulator stack includes a floating plate 512, which includes a layer of metal silicide as represented by the dotted line. The floating plate 512 is sandwiched between a first tunnel oxide and a second tunnel oxide in the gate insulator stack. A window is formed in the first tunnel oxide such that, when the metal silicide layer is deposited, it contacts the second diffusion region. This junction between the metal silicide layer and the second diffusion region provides the Schottky diode FIG. 5D illustrates a cross-sectional view taken along line 5D-5D of FIG. 5A. The transistor active regions are formed in an n-type substrate, and are separated by isolation regions. A first tunnel oxide layer is formed above the n-type substrate, a floating plate, including a metal silicide layer 512, is formed above the first tunnel oxide layer, and a second tunnel oxide layer is formed above the floating plate. The word line includes a p+ doped polysilicon region 572, which corresponds to the asymmetric p+ source/drain mask. Bit lines are formed above the word line as illustrated.

Figure 5E:
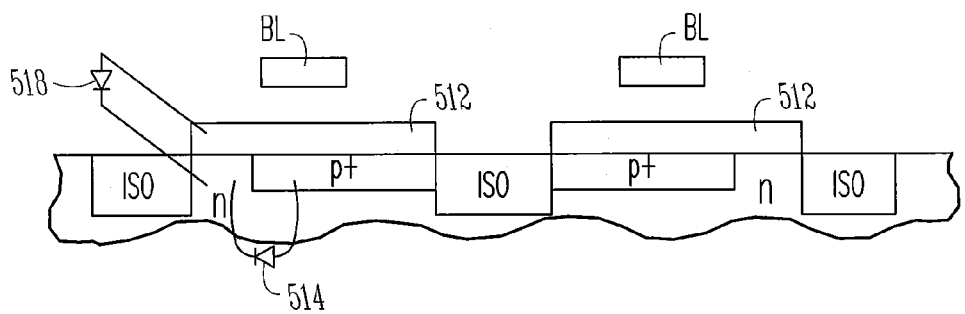
FIG. 5E illustrates a cross-sectional view taken along line 5E-5E of FIG. 5A.

FIG. 5E illustrates a cross-sectional view taken along line 5E-5E of FIG. 5A. The transistor active regions are formed in an n-type substrate, and are separated by isolation regions. The asymmetric p+ source/drain mask provides the illustrated doping profile in which both an n substrate and a p+ diffusion region share a top surface of the transistor active regions. The first tunnel oxide is selectively removed from the top surface at source or storage node region of the cell so that the metal silicide layer 512 directly contacts both the n substrate and the p+ second diffusion region or source. A lateral semiconductor junction diode is formed by the p+-n junction as illustrated by diode 514. The junction between the n+ diffusion region and the metal silicide is an ohmic contact. A Schottky diode is formed by the junction between the metal silicide and the n substrate as illustrated by diode 518. Bit lines are formed above the transistor active regions as illustrated.

Table 1 illustrates cell operations in various embodiments for an

NFET NVDRAM for which Vdd is Approximately Equal to 2.5 V.

TABLE 1

| Operation | Node potentials: | | | | Remark |
|---|---|---|---|---|---|
| | Bit Line | Word Line | Sub-strate | Storage Node (S) | |
| Write 1 (High) | +5 V | 2.5 V | 0 V | Float | Reverse biased diode. Floating plate of the addressed bit is charged: $V_T$ Change: $V_T(0) \rightarrow V_T(1) =$ 2.5 V |
| Write 0 (Low) | 0 V | 0 V | 2.5 V | Float | Forward biased diode. Current (holes) neutralize charges of the addressed Bit: $V_T$ Change: $V_T(1) \rightarrow V_T(0) =$ 1.0 V |
| Half-select cells | 0 V | 2.5 V | 0 V | Float | No change in state. |
| Read 1 | Float | 2.5 V | 0 V | Float (1) | Device Off: No change in Bit Line potential. |
| Read 0 | Float | 2.5 V | 0 V | Float (0) | Device On: Change in Bit Line potential sensed. |

One of ordinary skill in the art will understand, upon reading and comprehending this disclosure, that other NVDRAM cell designs may require other cell operations.

Figure 6:
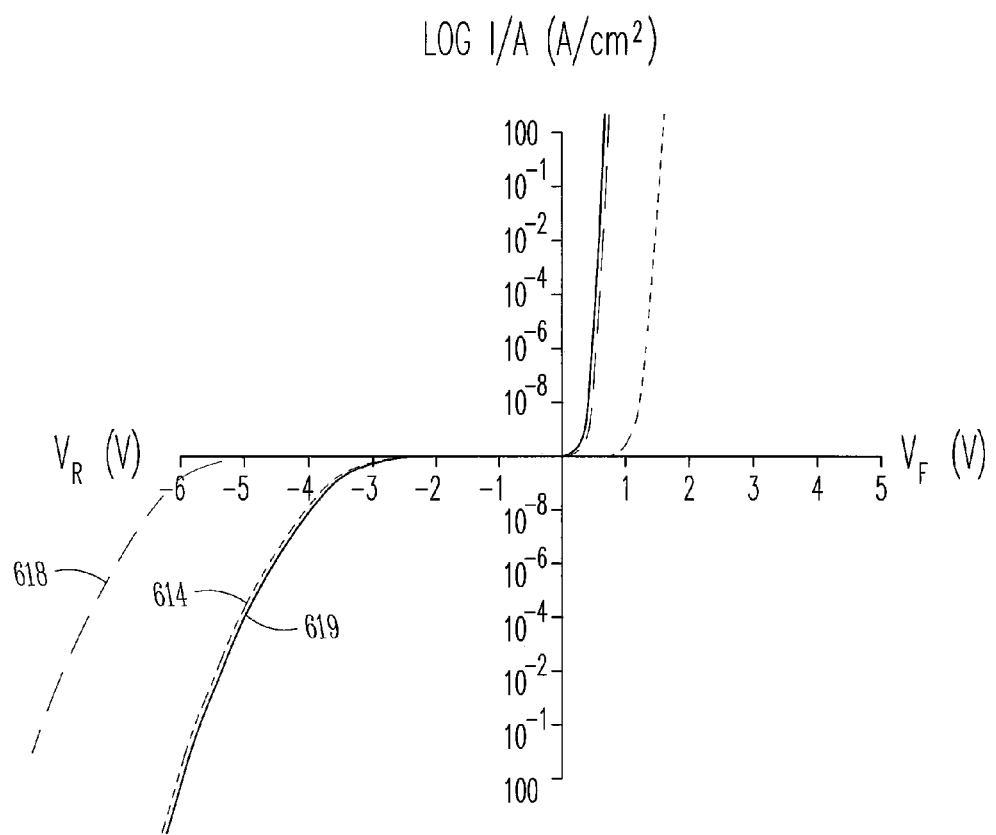
FIG. 6 illustrates forward and reverse characteristics for the Schottky diode and the lateral semiconductor junction diode individually, and further illustrates the forward and reverse characteristics for the combination of the Schottky diode and the lateral semiconductor junction diode.

FIG. 6 illustrates forward and reverse characteristics for the Schottky diode 618 and the lateral semiconductor junction diode 614 individually, and further illustrates the forward and reverse characteristics for the combination 619 of the Schottky diode and the lateral semiconductor junction diode. The difference in the characteristics of the parallel diodes are significant. The illustrated combined characteristics of the two diodes define the write/erase conditions and characteristics of the cell.

System Level

Figure 7:
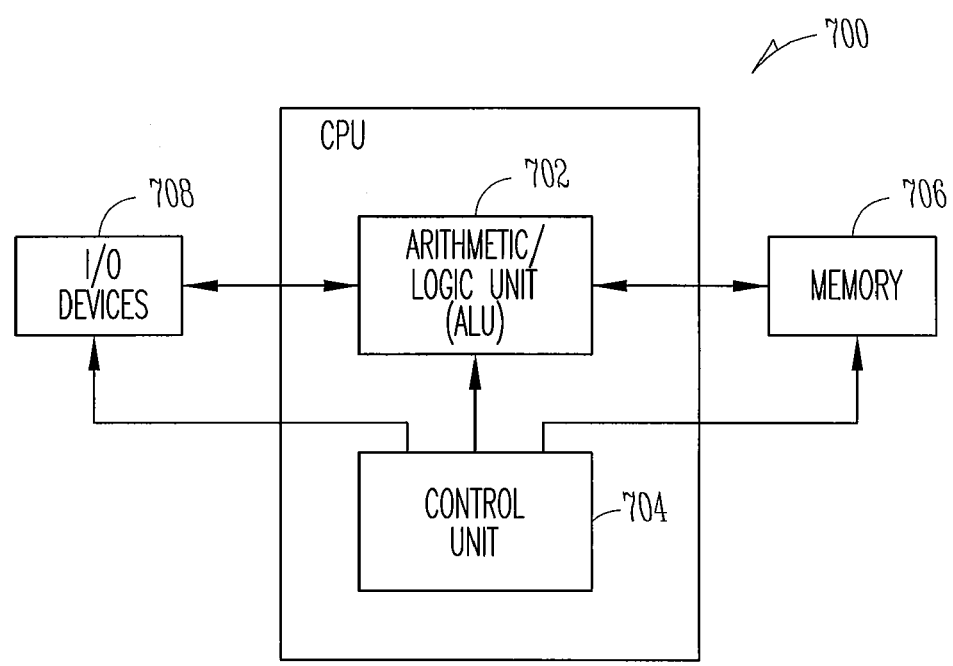
FIG. 7 is a high-level block diagram of an electronic system according to various embodiments of the present subject matter.

FIG. 7 is a high-level block diagram of an electronic system according to various embodiments of the present subject matter. In various embodiments, the system 700 is a computer system, a process control system or other system that employs a processor and associated memory. The electronic system 700 has functional elements, including a processor or arithmetic/logic unit (ALU) 702, a control unit 704, a memory device unit 706 and an input/output (I/O) device 708. Generally such an electronic system 700 will have a native set of instructions that specify operations to be performed on data by the processor 702 and other interactions between the processor 702, the memory device unit 706 and the I/O devices 708. The control unit 704 coordinates all operations of the processor 702, the memory device 706 and the I/O devices 708 by continuously cycling through a set of operations that cause instructions to be fetched from the memory device 706 and executed. According to various embodiments, the memory device 706 includes, but is not limited to, random access memory (RAM) devices, read-only memory (ROM) devices, and peripheral devices such as a floppy disk drive and a compact disk CD-ROM drive. As one of ordinary skill in the art will understand, upon reading and comprehending this disclosure, any of the illustrated electrical components are capable of being fabricated to include a one-device NVDRAM cell in accordance with the present subject matter.

The illustration of system, as shown in FIG. 7, is intended to provide a general understanding of one application for the structure and circuitry of the present subject matter, and is not intended to serve as a complete description of all the elements and features of an electronic system using NVDRAM cells according to the present subject matter. As one of ordinary skill in the art will understand, such an electronic system can be fabricated in single-package processing units, or even on a single semiconductor chip, in order to reduce the communication time between the processor and the memory device.

Applications containing NVDRAM cells, as described in this disclosure, include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

Figure 8:
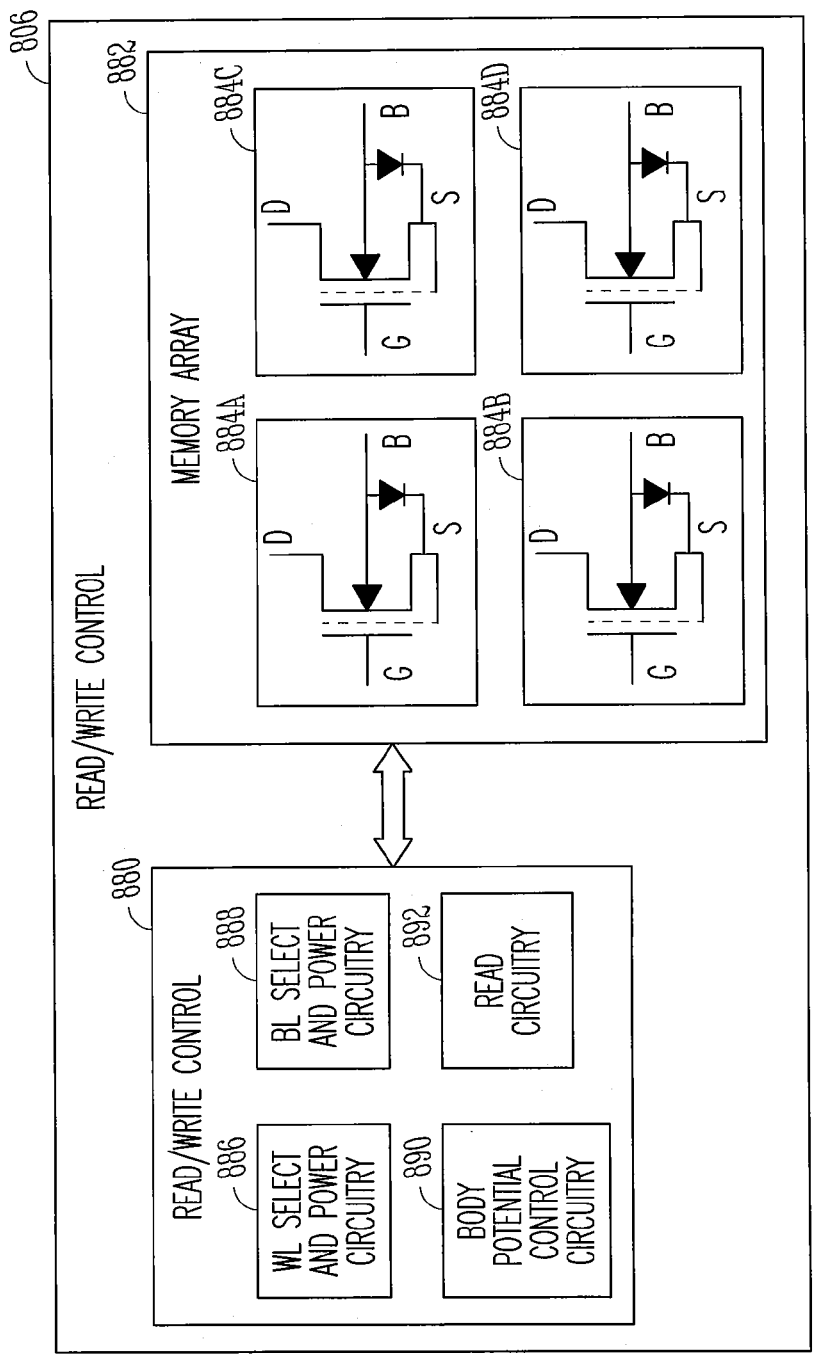
FIG. 8 is a simplified block diagram of a memory device according to various embodiments of the present subject matter.

FIG. 8 is a simplified block diagram of a memory device according to various embodiments of the present subject matter. The illustrated memory device 806 includes read/write control circuitry 880 to communicate with a memory array 882 of NVDRAM cells 884A-D. The read/write control circuitry 880 includes a word line select and power circuitry 886 to provide a pulse on a selected word line. The read/write control circuitry 880 includes a bit line select and power circuitry 888 to provide a pulse on a selected bit line. The read/write control circuitry 880 includes a body potential control circuitry 890. One of ordinary skill in the art will understand that, in various embodiments in which the body region of the memory cells is formed from a well, the body control circuitry includes selection circuitry to provide a pulse to a selected well. The read/write control circuitry 880 includes read circuitry 892 to sense the state of the cell by detecting potential changes on the bit lines.

The present subject matter relates to a non-volatile memory cell. The memory cell includes a switching transistor that is fabricated with a built-in floating plate in the gate insulator stack and at least one built-in diode. The floating plate is charged using a built-in lateral semiconductor junction diode when the cell is written. In various embodiments, a forward biased Schottky diode is used to discharge the floating plate. Programming the cell is fast, and does not require high voltage programming.

This disclosure refers to several figures that resemble flow diagrams. One of ordinary skill in the art will understand, upon reading and comprehending this disclosure, that the methods related to the flow diagrams may occur in the order as illustrated in the flow diagrams, and may be ordered in another manner. Thus, the present subject matter is not limited to a particular order or logical arrangement.

Although specific embodiments have been illustrated and described herein, it will be appreciated by those of ordinary skill in the art that any arrangement which is calculated to achieve the same purpose may be substituted for the specific embodiments shown. This application is intended to cover adaptations or variations of the present subject matter. It is to be understood that the above description is intended to be illustrative, and not restrictive. Combinations of the above embodiments, and other embodiments, will be apparent to those of skill in the art upon reviewing the above description. The scope of the present subject matter should be determined with reference to the appended claims, along with the full scope of equivalents to which such claims are entitled.

What is claimed is:

1. A method of fabricating a one device non-volatile memory cell, comprising:
    forming a gate insulator on a substrate, wherein the gate insulator is formed to expose a portion of the substrate over a desired second diffusion region;
    forming a metal silicide on the gate insulator such that the metal silicide contacts the substrate at the desired second diffusion region and does not extend over a desired first diffusion region;
    forming a metal oxide on the metal silicide;
    forming a tunnel insulator on the metal oxide;
    forming a gate on the tunnel insulator; and
    forming a first diffusion region at the desired first diffusion region, a second diffusion region at the second desired diffusion region, and a body region.

2. The method of claim 1, wherein forming the first diffusion region, the second diffusion region, and a body region includes implanting ions.

3. The method of claim 1, wherein the metal silicide includes a transition metal silicide.

4. The method of claim 1, wherein the metal oxide includes a transition metal oxide.

5. The method of claim 1, wherein forming the metal silicide includes contacting the substrate to form a Schottky diode between the substrate and the metal silicide.

6. The method of claim 1, wherein the one device non-volatile memory cell includes a p-channel device.

7. The method of claim 1, wherein the one device non-volatile memory cell includes an n-channel device.

8. A method of fabricating a one device non-volatile memory cell, comprising:
    forming a gate insulator on a substrate that exposes a portion of the substrate over a desired second diffusion region;
    forming a metal silicide on the gate insulator, including forming a Schottky diode between the substrate at the desired second diffusion region and the metal silicide layer;
    forming a metal oxide on the metal silicide;

forming a tunnel insulator on the metal oxide;
forming a gate on the tunnel insulator; and
implanting ions to define a first diffusion region, a second diffusion region at the desired second diffusion region, and a body region.

9. The method of claim 8, wherein the metal silicide includes a transition metal silicide.

10. The method of claim 8, wherein the metal oxide includes a transition metal oxide.

11. The method of claim 8, wherein the one device non-volatile memory cell includes a p-channel device.

12. The method of claim 8, wherein the one device non-volatile memory cell includes an n-channel device.

13. A method of fabricating a one device non-volatile memory cell, comprising:
providing a substrate;
depositing a first tunnel oxide layer on the substrate;
removing a portion of the first tunnel oxide layer over a desired second diffusion region;
depositing a metal silicide layer on the first tunnel oxide layer such that the metal silicide layer contacts the substrate at the desired second diffusion region and does not extend over a desired first diffusion region;
depositing a metal oxide layer on the metal silicide layer;
depositing a second tunnel oxide layer on the metal oxide layer;
depositing a polysilicon layer on the second tunnel oxide layer;
selectively removing portions of the polysilicon layer to define a gate; and
implanting ions to define a first diffusion region at the desired first diffusion region, a second diffusion region at the desired second diffusion region, and a body region.

14. The method of claim 13, wherein depositing a metal silicide layer includes depositing a transition metal silicide layer.

15. The method of claim 13, wherein depositing a metal oxide layer includes depositing a transition metal oxide layer.

16. The method of claim 13, wherein depositing a metal silicide layer includes contacting the substrate to form a Schottky diode between the substrate and the metal silicide layer.

17. The method of claim 13, wherein implanting ions includes using an asymmetric diffusion mask to form a lateral junction diode between the substrate and the second diffusion region and to form a Schottky diode between the substrate and the metal silicide layer.

18. A method of fabricating a one device non-volatile memory cell, comprising:
providing a substrate;
depositing a first tunnel oxide layer on the substrate;
removing a portion of the first tunnel oxide layer over a desired second diffusion region;
depositing a transition metal silicide layer on the first tunnel oxide layer such that the transition metal silicide layer contacts the substrate at the desired second diffusion region and does not extend over a desired first diffusion region;
depositing a transition metal oxide layer on the transition metal silicide layer;
depositing a second tunnel oxide layer on the transition metal oxide layer;
depositing a polysilicon layer on the second tunnel oxide layer;
selectively removing portions of the polysilicon layer to define a gate; and
implanting ions to define a first diffusion region at the desired first diffusion region, a second diffusion region at the desired second diffusion region, and a body region, including using an asymmetric diffusion mask to form a lateral junction diode between the substrate and the second diffusion region and to form a Schottky diode between the substrate and the transition metal silicide layer.

19. The method of claim 18, wherein providing a substrate includes providing a P type substrate, and implanting ions includes implanting ions to provide an N+ type first diffusion region and an N+ type second diffusion region.

20. The method of claim 18, wherein providing a substrate includes providing an N type substrate, and implanting ions includes implanting ions to provide a P+ type first diffusion region and a P+ type second diffusion region.

* * * * *

UNITED STATES PATENT AND TRADEMARK OFFICE
CERTIFICATE OF CORRECTION

PATENT NO.        : 7,485,513 B2                                             Page 1 of 1
APPLICATION NO. : 11/475312
DATED             : February 3, 2009
INVENTOR(S)       : Bhattacharyya It is certified that error appears in the above-identified patent and that said Letters Patent is hereby corrected as shown below:

In column 1, line 17, after "Asymmetric" insert -- Bandgap --.

Signed and Sealed this

Nineteenth Day of May, 2009

JOHN DOLL
*Acting Director of the United States Patent and Trademark Office*